United States Patent
Lin et al.

(10) Patent No.: US 9,040,835 B2
(45) Date of Patent: May 26, 2015

(54) ATTENUATION REDUCTION GROUNDING STRUCTURE FOR DIFFERENTIAL-MODE SIGNAL TRANSMISSION LINES OF FLEXIBLE CIRCUIT BOARD

(71) Applicant: ADVANCED FLEXIBLE CIRCUITS CO., LTD., Taoyuan County (TW)

(72) Inventors: Gwun-Jin Lin, Taoyuan County (TW); Kuo-Fu Su, Taoyuan County (TW); Chih-Heng Chuo, Taoyuan County (TW)

(73) Assignee: Advanced Flexible Circuits Co., Ltd., Taoyuan County (TW)

( * ) Notice: Subject to any disclaimer, the term of this patent is extended or adjusted under 35 U.S.C. 154(b) by 0 days.

(21) Appl. No.: 14/108,790

(22) Filed: Dec. 17, 2013

(65) Prior Publication Data

US 2014/0374147 A1    Dec. 25, 2014

(30) Foreign Application Priority Data

Jun. 19, 2013 (TW) ............... 102121673 A

(51) Int. Cl.
| | |
|---|---|
| *H05K 1/00* | (2006.01) |
| *H05K 1/11* | (2006.01) |
| *H02G 15/08* | (2006.01) |
| *H05K 9/00* | (2006.01) |
| *H05K 1/02* | (2006.01) |
| *H05K 3/40* | (2006.01) |

(52) U.S. Cl.
CPC ............ *H05K 1/0245* (2013.01); *H05K 1/0225* (2013.01); *H05K 1/118* (2013.01); *H05K 3/4069* (2013.01); *H05K 2201/09845* (2013.01)

(58) Field of Classification Search
CPC .................................................. H05K 1/0237
USPC ........... 174/254, 257, 259, 262, 267, 268, 69, 174/72 R; 361/749, 816, 818
See application file for complete search history.

(56) References Cited

U.S. PATENT DOCUMENTS

| | | | |
|---|---|---|---|
| 6,252,176 B1 * | 6/2001 | Kuramochi et al. .......... | 174/255 |
| 2003/0188889 A1 * | 10/2003 | Straub et al. .................. | 174/262 |
| 2008/0083559 A1 * | 4/2008 | Kusamitsu .................... | 174/254 |
| 2009/0188702 A1 * | 7/2009 | Muro et al. ................... | 174/254 |
| 2009/0244859 A1 * | 10/2009 | Muro et al. ................... | 361/749 |
| 2012/0048597 A1 * | 3/2012 | Lin et al. ....................... | 174/254 |
| 2013/0126232 A1 * | 5/2013 | Sakuma ........................ | 174/72 A |

* cited by examiner

*Primary Examiner* — Hoa C Nguyen
(74) *Attorney, Agent, or Firm* — Rosenberg, Klein & Lee

(57) ABSTRACT

An attenuation reduction grounding structure of differential-mode signal transmission lines of a flexible circuit board includes a flexible substrate on which at least one pair of differential-mode signal lines, at least one grounding line, a covering insulation layer, and a thin metal foil layer are formed. At least one via hole extends through the thin metal foil layer and the covering insulation layer and corresponds to a conductive contact zone of the grounding line. The via hole is filled with a conductive paste layer to electrically connect the thin metal foil layer to the conductive contact zone of the grounding line to provide an excellent grounding arrangement. The thin metal foil layer includes a plurality of openings formed at locations corresponding to top angles of the differential-mode signal lines.

10 Claims, 6 Drawing Sheets

ATTENUATION REDUCTION GROUNDING STRUCTURE FOR DIFFERENTIAL-MODE SIGNAL TRANSMISSION LINES OF FLEXIBLE CIRCUIT BOARD

BACKGROUND OF THE INVENTION

1. Field of the Invention

The present invention relates to the design of an attenuation reduction grounding structure of high-frequency signal transmission lines of a circuit board, and in particular to an attenuation reduction grounding structure of differential-mode signal transmission lines of a flexible circuit board, which comprises at least one vie hole extending through a thin metal foil layer, a bonding material layer, and a covering insulation layer formed on the flexible circuit board and corresponding to a conductive contact zone of a grounding line, with the via hole being filled with a conductive paste material layer to electrically connect the thin metal foil layer to the conductive contact zone of the grounding line.

2. The Related Arts

Most electronic devices are provided with circuit boards or flexible flat cables to position all necessary circuit components and connectors and realize transmission of electronic signals. In the manufacture of a circuit board, wires are laid on a surface of a substrate to form an extended signal transmission line for transmission of the electronic signals.

A flexible substrate of a flexible circuit board comprises a plurality of differential-mode signal lines formed on a surface thereof to be parallel and spaced from each other by a predetermined spacing distance. The differential-mode signal lines are arranged in pair and generally in combination with an adjacent grounding line. A covering insulation layer is formed on a surface of the substrate and covers surfaces of the differential-mode signal lines and the grounding line. To achieve an effect of shielding, a shielding layer is commonly formed to cover a surface of the insulation layer and is grounded.

In transmission of a differential-mode signal through the differential-mode signal transmission lines, if the grounding line has a poor grounding effect, then the differential-mode signal lines regard the shielding layer and the grounding line that is actually grounded as two grounding surfaces. This leads to interference of signal and affects the performance and reliability of transmission of high-frequency signals.

Further, the differential-mode signal lines are generally made of a copper foil material or a composite material and are of a structure having a cross-section of a substantially flat configuration. Ideally, the differential-mode signal lines each have opposite sidewalls that are normal to the surface of the flexible substrate. However, in a real structure, the two sidewalls of a differential-mode signal line show a slope shift amount (namely being non-vertical sidewalls), so that a left top corner and a right top corner of the differential-mode signal line each form a top angle structure and a left bottom corner and a right bottom corner of the differential-mode signal line each form a bottom angle structure.

In the transmission of an electronic signal having a relatively low frequency, the angle structures of the differential-mode signal line do not cause any problem. However, in the transmission of a high-frequency signal, the top angle structures and the bottom angle structures may cause attenuation of the signal. Such a situation leads to problems of poor signal transmission reliability, poor impedance control, and signal interference in the transmission of a high-frequency signal through the high-frequency signal transmission lines that are commonly used in the contemporarily available electronic devices.

SUMMARY OF THE INVENTION

Thus, an object of the present invention is to provide an attenuation reduction grounding structure that controls a circuit board in transmission of high-frequency signals and is particularly an improved structure that suits the needs for resisting attenuation of a flexible circuit board, which is generally thin and light-weighted and flexible, in transmission of high-frequency signals.

To achieve the above object, the present invention provides a thin metal foil layer is bonded by a bonding material layer to a covering insulation layer on a surface of a flexible substrate to serve as an attenuation reduction grounding layer. At least one via hole extends through the thin metal foil layer, the bonding material layer, and the covering insulation layer and corresponds to a conductive contact zone of a grounding line formed on the flexible substrate. The via hole receives a conductive paste layer filled therein to electrically connect the thin metal foil layer to the conductive contact zone of the grounding line.

In a preferred embodiment of the present invention, the via hole is formed in a connection section of the flexible substrate. With the conductive paste layer filled in the via hole, the thin metal foil layer is electrically connected, in the connection section of the flexible substrate, to the grounding line.

In another embodiment of the present invention, the via hole is formed in an extension section of the flexible substrate. The flexible substrate comprises, in the extension section, a plurality of slit lines formed by cutting in the extension direction so as to form a plurality of cluster lines. With the conductive paste layer filled in the via hole, the thin metal foil layer is electrically connected, in the extension section of the flexible substrate, to the grounding line.

Further, the thin metal foil layer according to the present invention comprises a plurality of openings formed at locations corresponding to top angles of the differential-mode signal lines. The openings can be circular, rectangular, or rhombus.

In respect of efficacy, the attenuation reduction grounding structure of differential-mode signal transmission lines of a flexible circuit board provided by the present invention provides the grounding line of the differential-mode signal lines with an excellent grounding effect, so that signal interference caused by poor grounding in the transmission of a high-frequency signal through high-frequency signal lines can be eliminated. Further, with the thin metal foil layer of the present invention comprising a plurality of openings formed at locations corresponding to top angles of the differential-mode signal lines, the differential-mode signal lines is provided with excellent attenuation reduction effect in transmission of a high-frequency signal, whereby excellent effects can be achieved for both performance and reliability of signal transmission.

BRIEF DESCRIPTION OF THE DRAWINGS

The present invention will be apparent to those skilled in the art by reading the following description of preferred embodiments of the present invention, with reference to the attached drawings, in which.

DETAILED DESCRIPTION OF THE PREFERRED EMBODIMENTS

Figure 1:
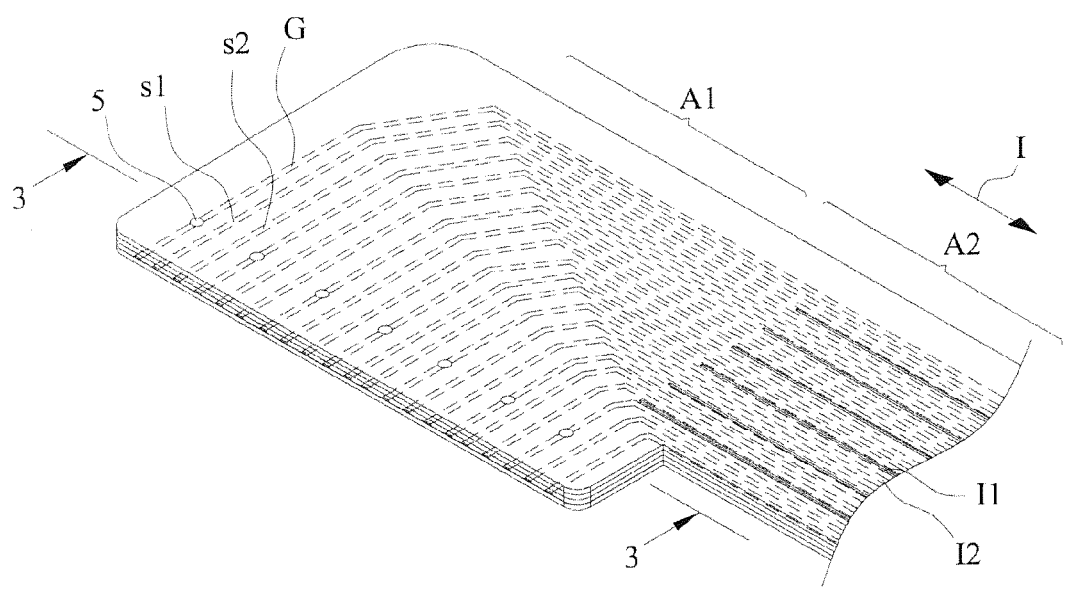
FIG. 1 is a perspective view showing a first embodiment of the present invention.
Figure 2:
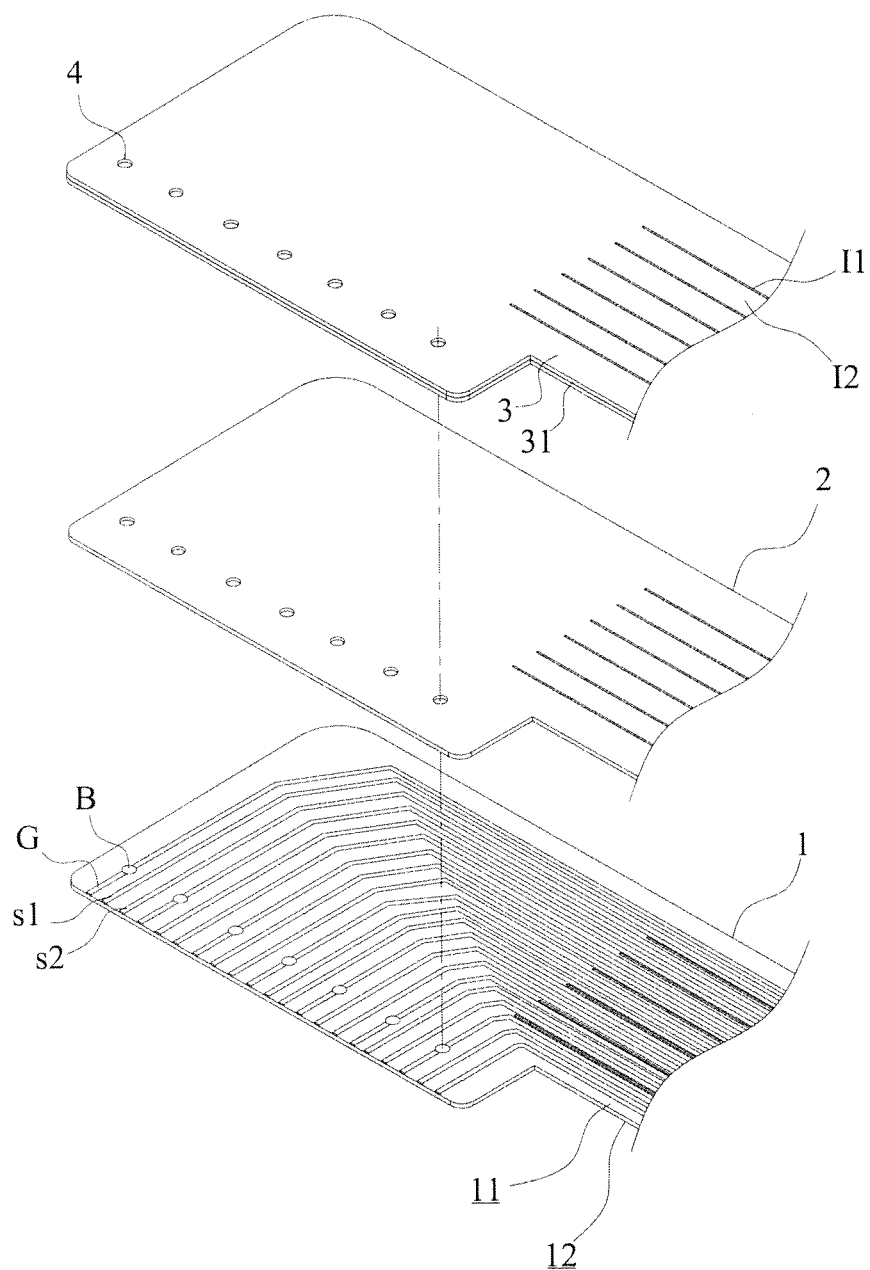
FIG. 2 is an exploded view of the first embodiment of the present invention.

With reference to the drawings and in particular to FIGS. 1 and 2, which are respectively a perspective view and an exploded view of a first embodiment of the present invention, as shown in the drawings, a flexible substrate 1 extends in an extension direction 1 and comprises a first surface 11 and a second surface 12. The flexible substrate 1 comprises at least one connection section A1 and an extension section A2 connected to the connection section A1. The flexible substrate 1 is cut, in the extension section A2, to form a plurality of slit lines 11 extending in the extension direction 1 so as to form a plurality of cluster lines 12.

A plurality of signal lines that is parallel to and spaced from each other by a predetermined distance is formed on the first surface 11 of the flexible substrate 1 to define at least one pair of differential-mode signal lines s1, s2 for transmitting a high-frequency differential-mode signal. The differential-mode signal lines s1, s2 are generally made of copper foil materials or composite materials and have a cross-section showing a flat configuration.

At least one grounding line G is formed on the first surface 11 of the substrate 1 and is isolated from the differential-mode signal lines s1, s2. The grounding line G comprises a conductive contact zone B defined at a selected location on the surface of the connection section A1.

A covering insulation layer 2 is formed to cover the first surface 11 of the substrate 1, the pair of differential-mode signal lines s1, s2, and a grounding line G. The covering insulation layer 2 is generally made of an insulation material and can be one of bonding sheet, coverlay, and ink.

A thin metal foil layer 3 is bonded to a surface of the covering insulation layer 2. The thin metal foil layer 3 is made of a thin metal foil material selected from one of a copper foil, an aluminum foil, and a nickel foil. The thin metal foil layer 3 is directly mounted to the surface of the covering insulation layer 2 or is alternatively bonded by a bonding material layer 31 to the surface of the covering insulation layer 2. The thin metal foil layer 3 provides an attenuation reduction effect of signals when the differential-mode signal lines s1, s2 transmit a high-frequency differential-mode signal, thereby providing the differential-mode signal lines s1, s2 with excellent attenuation reduction effect of signals and thus ensuring excellent effects associated with performance and reliability of signal transmission.

Figure 3:
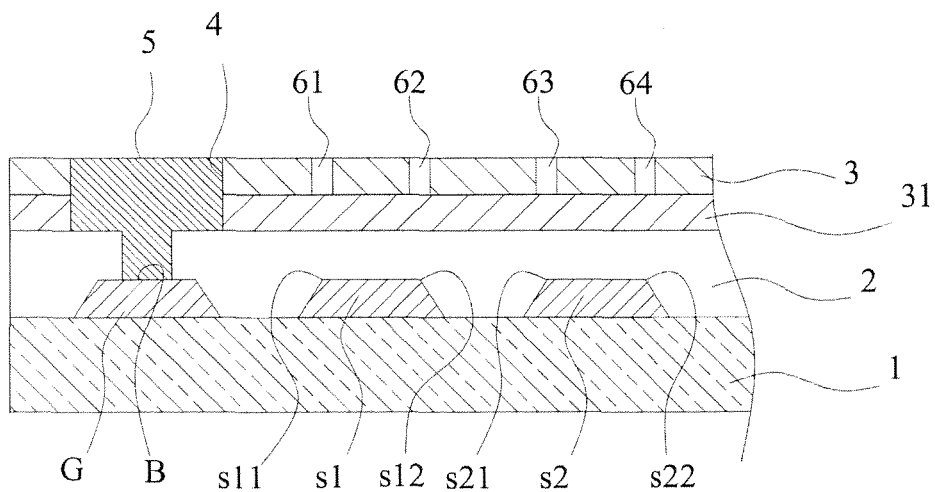
FIG. 3 is a cross-sectional view taken along line 3-3 of FIG. 1.
Figure 4:
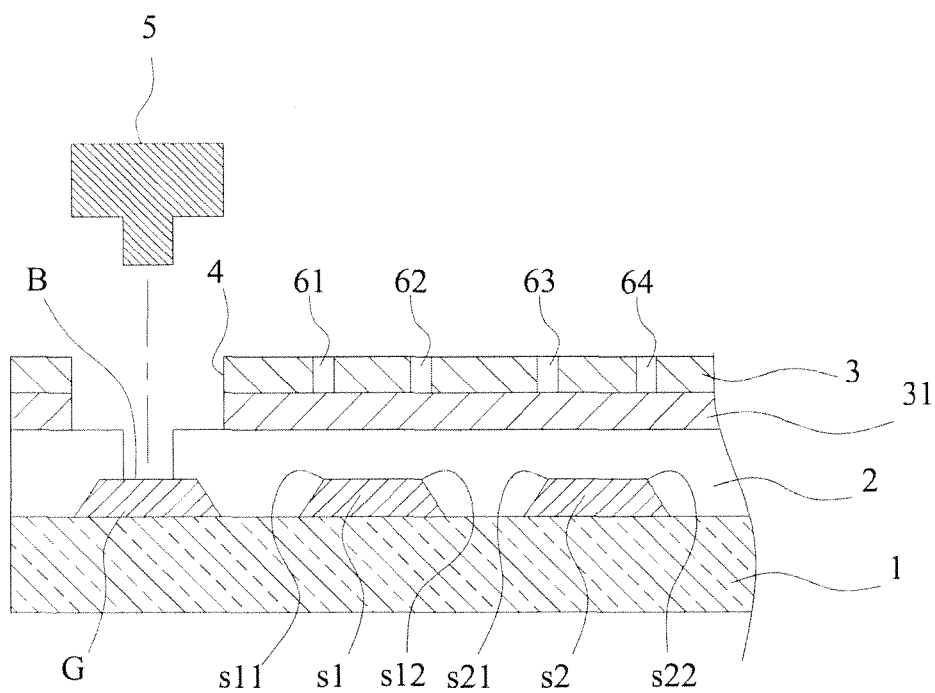
FIG. 4 is a cross-sectional view showing a conductive paste layer of FIG. 3 in a separated condition.

Referring to FIG. 3, which is a cross-sectional view taken along line 3-3 of FIG. 1, and FIG. 4 being a cross-sectional view showing a conductive paste layer of FIG. 3 in a separated condition, as shown in the drawings, at least one via hole 4, which extends through the thin metal foil layer 3, the bonding material layer 31, and the covering insulation layer 2, is formed to correspond to the conductive contact zone B of the grounding line G. In the instant embodiment, the via hole 4 is formed at a location in the connection section A1 of the flexible substrate 1. The connection section A1 can be of a conventional finger pad insertion structure or may be coupled to a conventional insertion slot or an electronic component.

In a preferred embodiment, the via hole has a bore formed in the thin metal foil layer 3 and the bonding material layer 31 and having a diameter that is greater than a diameter of a bore of the via hole that is formed in the covering insulation layer 2. Further, the thin metal foil layer 3 comprises a plurality of openings 61, 62 formed at locations corresponding to top angles s11, s12 of the differential-mode signal line s1. The openings 61, 62 can be of a shape that is one of a circle, a rectangle, and a rhombus. The arrangement of the plurality of openings 61, 62 corresponding to the top angles s11, s12 of the differential-mode signal line s1 forms an attenuation reduction pattern for the differential-mode signal line s1.

Similarly, the thin metal foil layer 3 comprises a plurality of openings 63, 64 formed at locations corresponding to top angles s21, s22 of the differential-mode signal line s2. The openings 63, 64 can be of a shape that is one of a circle, a rectangle, and a rhombus. The arrangement of the plurality of openings 63, 64 corresponding to the top angles s21, s22 of the differential-mode signal line 21 forms an attenuation reduction pattern for the differential-mode signal line s2.

A conductive paste layer 5 is filled in the via hole 4 to electrically connect the thin metal foil layer 3 to the conductive contact zone B of the grounding line G. The conductive paste layer can be a silver paste. The conductive paste layer is filled in the via hole 4 in a liquid form and is then cured to form the conductive paste layer 5 in the via hole 4.

Figure 5:
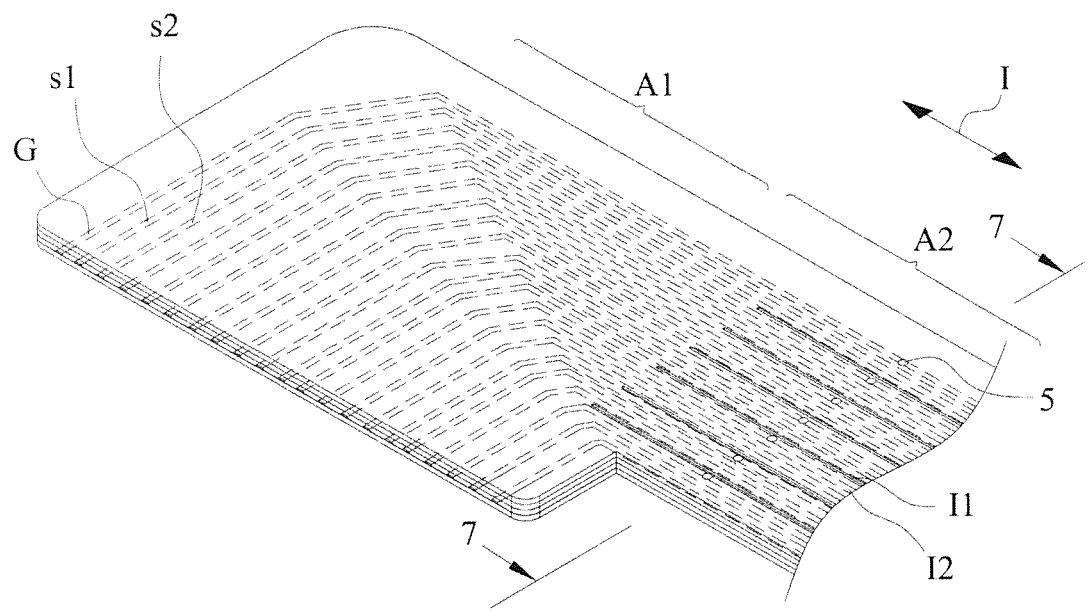
FIG. 5 is a perspective view showing a second embodiment of the present invention.
Figure 6:
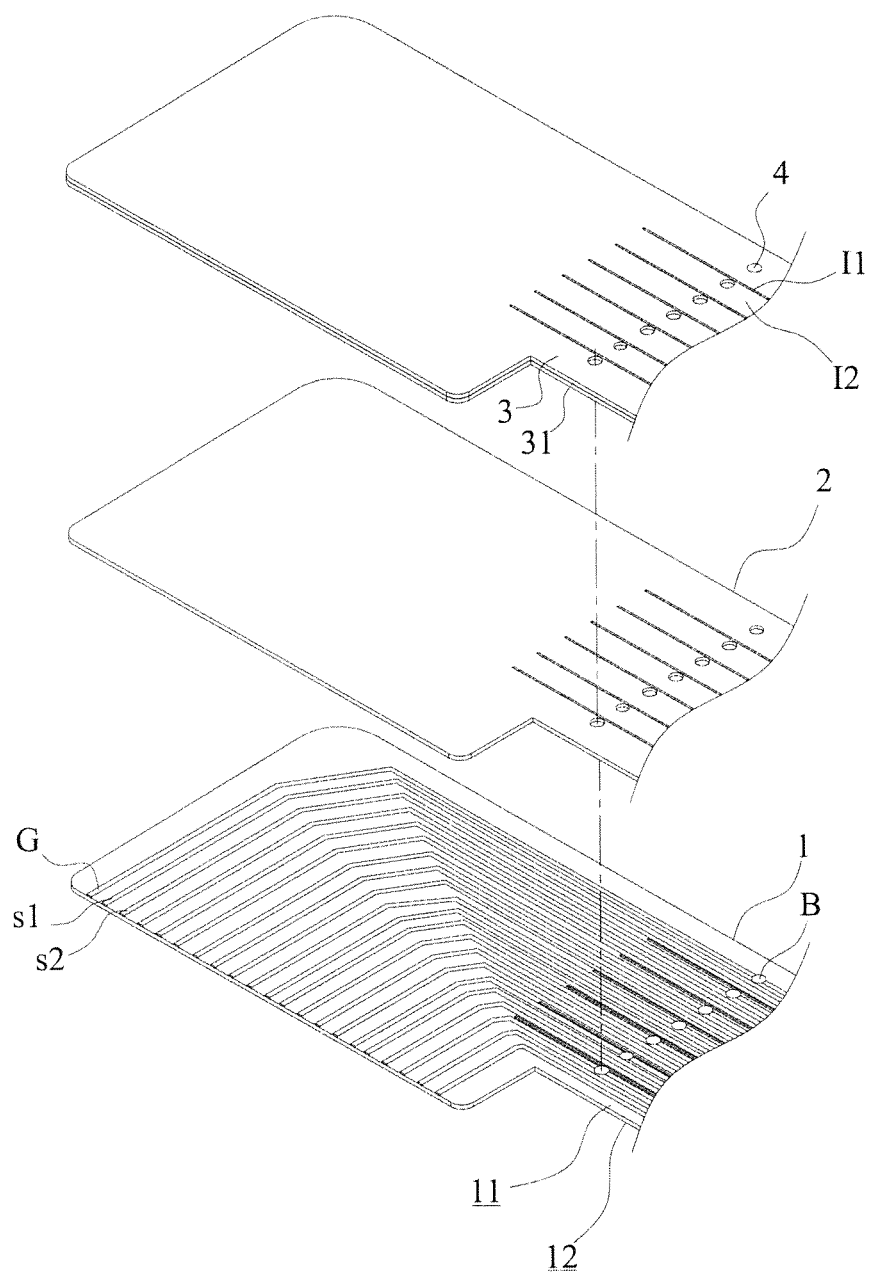
FIG. 6 is an exploded view of the second embodiment of the present invention.
Figure 7:
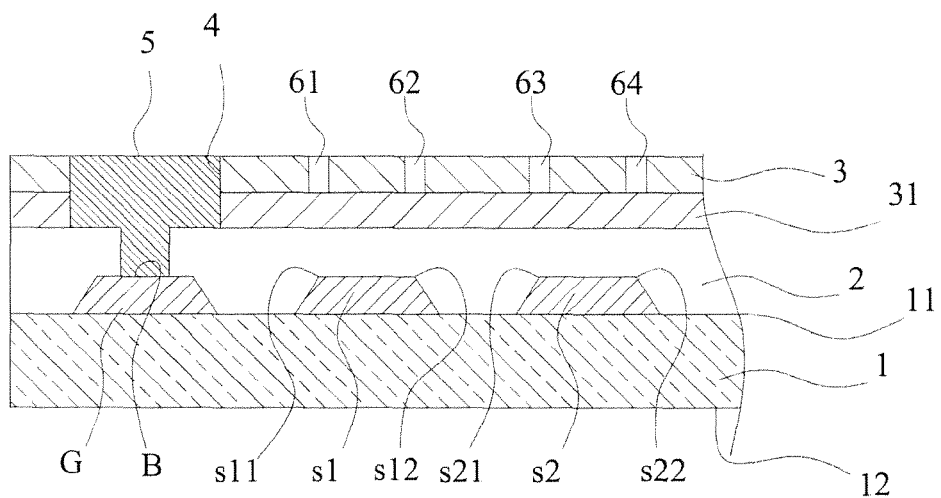
FIG. 7 is a cross-sectional view taken along line 7-7 of FIG. 5.
Figure 8:
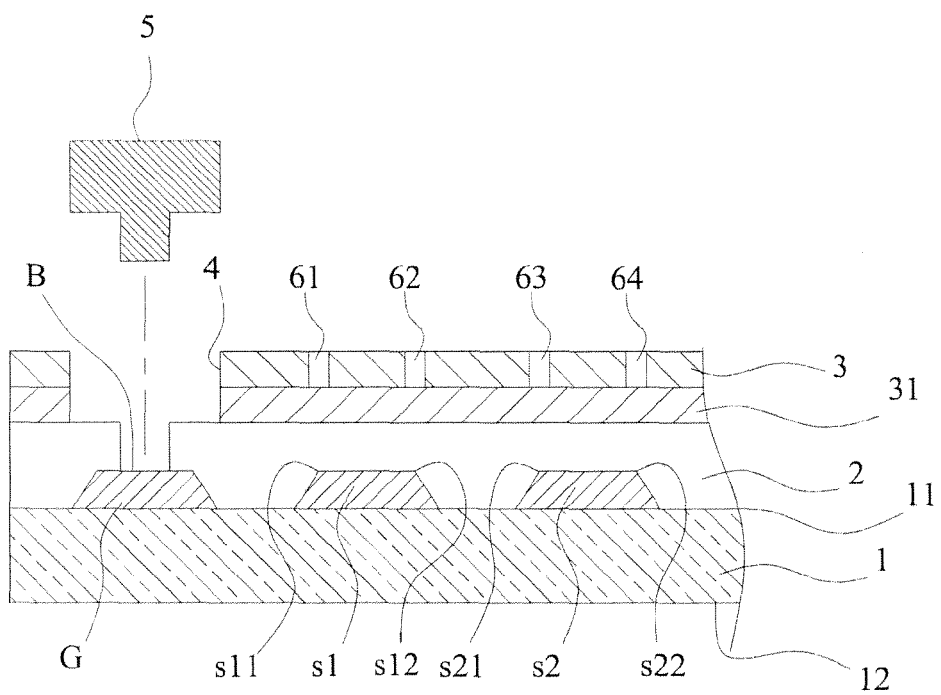
FIG. 8 is a cross-sectional view showing a conductive paste layer of FIG. 7 in a separated condition.

Referring to FIGS. 5 and 6, which are respectively a perspective view and an exploded view of a second embodiment of the present invention, FIG. 7 being a cross-sectional view taken along line 7-7 of FIG. 5, and FIG. 8 being a cross-sectional view showing a conductive paste layer of FIG. 7 in a separated condition, the instant embodiment comprises a structure that is substantially the same as that of the first embodiment and a difference is that the via hole 4 is formed at a location in the extension section A2 of the flexible substrate 1.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A flexible circuit board with an attenuation reduction grounding structure for differential-mode signal transmission lines of the flexible circuit board, comprising:

a flexible substrate, which extends in an extension direction and comprises a first surface and a second surface, the flexible substrate comprising at least one connection section and an extension section connected to the connection section;

at least one pair of differential-mode signal lines, which are formed on the first surface of the flexible substrate to be adjacent to each other and isolated from each other, each of the differential-mode signal lines having a pairs of top angles;

at least one grounding line, which is formed on the first surface of the substrate and isolated from the differential-mode signal lines, the grounding line comprising a conductive contact zone formed on at least one selected location of a surface of the connection section;

a covering insulation layer, which is formed to cover the first surface of the substrate, the pair of differential-mode signal lines, and the grounding line;

a thin metal foil layer, which is bonded to a surface of the covering insulation layer and electrically connected to the conductive contact zone of the grounding line, the thin metal foil layer comprises a plurality of openings formed at locations corresponding to the pairs of top angles of the differential-mode signal lines respectively; and;

at least one via hole, which is formed in the connection section of the flexible substrate, the via hole extending through the thin metal foil layer and the covering insulation layer and corresponding to the conductive contact zone of the grounding line.

2. The flexible circuit board as claimed in claim 1, wherein the thin metal foil layer is made of a thin metal foil material selected from one of a copper foil, an aluminum foil, and a nickel foil.

3. The flexible circuit board as claimed in claim 1, wherein the thin metal foil layer is bonded by a bonding material layer to the surface of the covering insulation layer.

4. The flexible circuit board as claimed in claim 1, further comprising a conductive paste layer filled in the via hole to electrically connect the thin metal foil layer to the conductive contact zone of the grounding line.

5. The flexible circuit board as claimed in claim 4, wherein the conductive paste layer is made of a silver paste and the conductive paste layer is filled in the via hole in a liquid form and is then cured to form the conductive paste layer in the via hole.

6. A flexible circuit board with an attenuation reduction grounding structure for differential-mode signal transmission lines of the flexible circuit board, comprising:

a flexible substrate, which extends in an extension direction and comprises a first surface and a second surface, the flexible substrate comprising at least one connection section and an extension section connected to the connection section;

at least one pair of differential-mode signal lines, which are formed on the first surface of the flexible substrate to be adjacent to each other and isolated from each other, each of the differential-mode signal lines having a pairs of top angles;

at least one grounding line, which is formed on the first surface of the substrate and isolated from the differential-mode signal lines, the grounding line comprising a conductive contact zone formed on at least one selected location of a surface of the extension section;

a covering insulation layer, which is formed to cover the first surface of the substrate, the pair of differential-mode signal lines, and the grounding line;

a thin metal foil layer, which is bonded to a surface of the covering insulation layer and electrically connected to the conductive contact zone of the grounding line, the thin metal foil layer comprises a plurality of openings formed at locations corresponding to the pairs of top angles of the differential-mode signal lines respectively; and at least one via hole, which is formed in the extension section of the flexible substrate, the via hole extending through the thin metal foil layer and the covering insulation layer and corresponding to the conductive contact zone of the grounding line, the extension section comprising a plurality of slit lines formed by cutting in the extension direction to define a plurality of cluster lines.

7. The flexible circuit board as claimed in claim 6, wherein the thin metal foil layer is made of a thin metal foil material selected from one of a copper foil, an aluminum foil, and a nickel foil.

8. The flexible circuit board as claimed in claim 6, wherein the thin metal foil layer is bonded by a bonding material layer to the surface of the covering insulation layer.

9. The flexible circuit board as claimed in claim 6, further comprising a conductive paste layer filled in the via hole to electrically connect the thin metal foil layer to the conductive contact zone of the grounding line.

10. The flexible circuit board as claimed in claim 9, wherein the conductive paste layer is made of a silver paste and the conductive paste layer is filled in the via hole in a liquid form and is then cured to form the conductive paste layer in the via hole.

* * * * *